United States Patent
Gaggl et al.

(10) Patent No.: US 7,034,729 B2
(45) Date of Patent: Apr. 25, 2006

(54) ADDING CIRCUIT SUITABLE FOR SIGMA-DELTA MODULATOR CIRCUITS

(75) Inventors: Richard Gaggl, Villach (AT); Maurizio Inversi, Padua (IT); Andreas Wiesbauer, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/935,675

(22) Filed: Sep. 2, 2004

(65) Prior Publication Data

US 2005/0093728 A1  May 5, 2005

(30) Foreign Application Priority Data

Sep. 11, 2003  (DE)  ................. 103 42 056

(51) Int. Cl.
*H03M 3/00*  (2006.01)
(52) U.S. Cl. .................. 341/143; 341/155; 341/172
(58) Field of Classification Search ................ 341/143, 341/155, 172, 150
See application file for complete search history.

(56) References Cited

U.S. PATENT DOCUMENTS

| 4,920,544 | A | * | 4/1990 | Endo et al. ................. 375/243 |
| 5,212,486 | A | * | 5/1993 | Nagaraj ....................... 341/172 |
| 5,818,374 | A | * | 10/1998 | Tan ............................. 341/143 |
| 5,982,313 | A | * | 11/1999 | Brooks et al. ............... 341/143 |
| 5,990,819 | A | * | 11/1999 | Fujimori ..................... 341/150 |
| 6,040,793 | A | * | 3/2000 | Ferguson et al. ........... 341/143 |
| 6,177,897 | B1 | * | 1/2001 | Williams, III ............... 341/150 |
| 6,271,782 | B1 | * | 8/2001 | Steensgaard-Madsen .... 341/143 |
| 6,278,750 | B1 | * | 8/2001 | Yu ............................. 375/345 |
| 6,304,608 | B1 | * | 10/2001 | Chen et al. ................. 375/252 |
| 6,346,898 | B1 | * | 2/2002 | Melanson .................... 341/143 |
| 6,393,070 | B1 | * | 5/2002 | Reber .......................... 375/340 |
| 6,426,714 | B1 | * | 7/2002 | Ruha et al. .................. 341/143 |
| 6,473,019 | B1 | * | 10/2002 | Ruha et al. .................. 341/143 |
| 6,839,011 | B1 | * | 1/2005 | Hong .......................... 341/143 |
| 6,882,861 | B1 | * | 4/2005 | Panasik et al. .......... 455/553.1 |
| 2002/0110189 | A1 | | 8/2002 | Souissi et al. |

FOREIGN PATENT DOCUMENTS

| EP | 0464500 | 9/1994 |
| EP | 0738439 | 4/1998 |
| EP | 0643477 | 12/1999 |
| EP | 0764368 | 5/2000 |
| GB | 2195848 | 4/1988 |
| GB | 2247369 | 2/1992 |

* cited by examiner

*Primary Examiner*—Jean Bruner Jeanglaude
(74) *Attorney, Agent, or Firm*—Dicke, Billig & Czaja, PLLC

(57) ABSTRACT

An adding circuit includes storage capacitors and a a switch mechanism, the storage capacitors being charged up via voltage signals to be added during a first clock phase. During a second clock phase, the storage capacitors are connected in parallel, with the result that a charge equalization occurs. After the charge equalization, the voltage dropped across the parallel-connected storage capacitors is equal to a sum of the signals to be added except for a scaling factor. In one embodiment, the adding circuit is used in a sigma-delta modulator circuit.

32 Claims, 1 Drawing Sheet

ADDING CIRCUIT SUITABLE FOR SIGMA-DELTA MODULATOR CIRCUITS

CROSS-REFERENCE TO RELATED APPLICATIONS

This Utility patent Application claims priority to German Patent Application No. DE 103 42 056.8, filed on Sep. 11, 2003, which is incorporated herein by reference.

FIELD OF THE INVENTION

The present invention relates to an adding circuit and a modular circuit employing an adding circuit.

BACKGROUND

Because of the reduced component sizes in circuits, there is a tendency in electronic circuits to reduce supply voltages used in the circuits. In conjunction with this reduced supply voltage, the maximum possible signal level is also reduced and a signal/noise ratio is impaired.

In the case of switched-capacitor sigma-delta modulator circuits, which are used, for example, in broadband data-transmission systems, the maximum possible signal level depends, for example, on a reference voltage that is limited in turn by the supply voltage. For a favorable signal-noise ratio, the chosen reference voltage should be as high as possible without saturation of the signal levels occurring at the nodes of the circuit. Alternatively, there is the possibility of achieving a specified signal/noise ratio by reducing the noise level through an appropriately modified design of the circuit.

One problem of the procedure of adapting the reference voltage to the lower supply voltage and achieving the specified signal/noise ratio by means of a reduction in the noise level is an increased current consumption of the circuit. For example, a reduction in the noise level by a factor of 2, i.e., by 3 dB, is associated with an approximate doubling of the power consumption.

In addition, in switched-capacitor sigma-delta modulator circuits, a thermal noise that is proportional to the reciprocal value of a circuit capacitance has to be reduced to the same extent, i.e., an increase in capacitances is necessary. The increase in capacitances is associated, in typical semiconductor circuits, with an increased space requirement on a semiconductor chip used to implement the circuit.

A further possibility for achieving the specified signal/noise ratio is to insert a feed-forward loop into the sigma-delta modulator circuit in addition to a loop filter and a feedback loop. Normally, in the case of sigma-delta modulator circuits, the loop filter comprises, for the purpose of noise shaping, at least one integrator or integrator means or a plurality of integrator or integrator means connected in series. An input signal for a quantization circuit is derived from an output signal of a final integrator or integrator means in the series connection. The feedback loop is designed to feed back an output signal of the quantization circuit to the signal inputs of the integrator or integrator means.

In this connection, the feed-forward loop serves the purpose of minimizing a signal component of an original input signal of the sigma-delta modulator circuit in the loop filter by forward-feeding an input signal of the sigma-delta modulator circuit to summation points or nodes of the sigma-delta modulator circuit. This enables the signal amplitudes at the summation points or nodes to be reduced at the signal input of integrator or integrator means in the loop filter so that a higher value can be chosen for the reference voltage without a saturation of the signals occurring at the respective nodes in the event of full modulation. Furthermore, simplified amplifier systems, in particular single-stage amplifier systems, may be used in the integrator or integrator means.

Forward-feeding the input signals of the sigma-delta modulator circuit requires further signal additions. In analog circuits, such as, for example, the loop filter of a sigma-delta modulator, the addition of signals is normally implemented with the aid of active blocks (e.g., operational amplifiers). An active block provided exclusively for the purpose of adding signals is necessary, in particular, for adding at the signal output of a final integrator or integrator means of the loop filter, i.e., at the signal input of the quantization circuit. One problem of this procedure is consequently an increased area requirement of the circuit arrangement on the semiconductor chip and also an increased power consumption.

SUMMARY

The present invention provides an adding circuit and a modular circuit having an adding circuit. In one embodiment, feeding forward an input signal of a switched-capacitor sigma-delta modulator circuit to a summation point or node at the signal input of a quantization circuit of the sigma-delta modulator circuit requires a further addition of signals. For this purpose, an adding circuit comprises storage capacitors and switching or switching means, the storage capacitors being charged up via voltage signals to be added during a first clock phase. During a second clock phase, the storage capacitors are connected in parallel, with the result that a charge equalization occurs. After the charge equalization, the voltage dropped across the parallel-connected storage capacitors is equal to a sum of the signals to be added except for a scaling factor.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention relates to an adding circuit, in particular an adding circuit for adding signals at the signal input of a quantization circuit in switched-capacitor sigma-delta modulator circuits, for example for use in broadband data-transmission systems.

Figure 1:
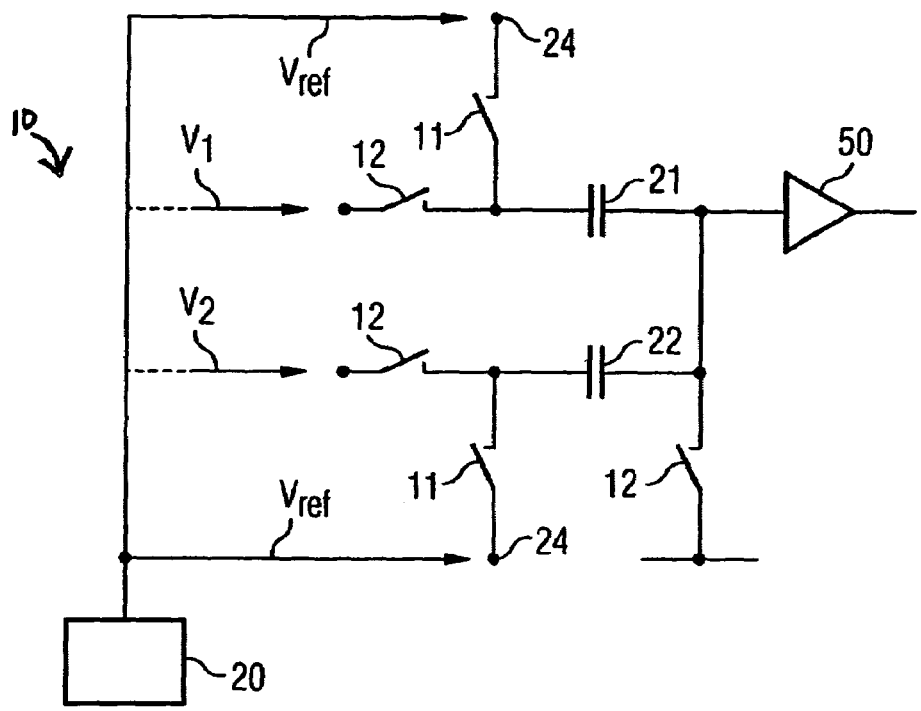
FIG. 1 illustrates an adding circuit for adding signals at the signal input of a quantization circuit in a switched-capacitor sigma-delta modulator circuit in accordance with one exemplary embodiment of the present invention.

FIG. 1 illustrates one exemplary embodiment of an adding circuit according to the invention at 10, configured to add a first signal $V_1$ to a second signal $V_2$. The adding circuit is configured for use at the signal input of a quantization circuit 50 in a switched-capacitor sigma-delta modulator circuit, i.e., the signals $V_1$, $V_2$ to be added are formed, for example, by an output signal of a loop filter and a feed-forward signal of a feed-forward loop. An input signal of the quantization circuit 50 is derived from an output signal of the adding circuit.

The signals $V_1$, $V_2$ are present at signal inputs of the adding circuit 10. The adding circuit 10 comprises a storage capacitor 21, 22 for each of the two signals $V_1$, $V_2$ to be added. Furthermore, the adding circuit 10 comprises switches, switch mechanism or switching means 11, 12. In one embodiment, the switching means are formed by field-effect transistors clock-driven by a clock voltage.

The switches, switch mechanism or switching means 11, 12 are driven by a clock voltage in such a way that, during a first clock phase, the switching means 11 belonging to a first group are open, while the switching means 12 belonging to a second group are closed. Consequently, during the first clock phase, each of the storage capacitors 21, 22 is connected at its first contact to the corresponding signal voltage $V_1$, $V_2$, while its second contact is connected to zero potential, with the result that each of the capacitors is charged with a charge determined by means of its capacitance and the respective signal voltage $V_1$, $V_2$.

Conversely to the situation during the first clock phase, during a second clock phase, the switching means 11 belonging to the first group are closed, while the switching means 12 belonging to the second group are open. During the second clock phase, the storage capacitors 21, 22 are connected in parallel. The first contacts of the storage capacitors 21, 22 are then connected in common to a reference-voltage input 24, while the second contacts of the storage capacitors 21, 22 are connected in common to the signal output of the adding circuit 10.

In the parallel-connected configuration of the storage capacitors 21, 22, a charge equalization occurs. The charge equalization occurs in such a way that a total charge equal to the sum of the individual stored charges is stored in a total capacitance equal to the sum of the individual capacitances of the storage capacitors 21, 22.

In the case of m signals to be added and m storage capacitors having essentially identical capacitances, the voltage $V_\tau$ dropped across the parallel-connected storage capacitors is given by $$V_T = \frac{Q_T}{C_T} = \frac{\sum_k Q_k}{\sum_k C_k} = \frac{C \sum_k V_k}{mC} = \frac{1}{m} \sum_k V_k$$

where $Q_\tau$ is the total charge stored in the storage capacitors, $C_\tau$ is the total capacitance of the parallel connection of storage capacitors, $Q_k$ is the charge stored in the kth storage capacitor, $V_k$ is the kth voltage signal, C is the identical capacitance of the storage capacitors and m is the number of signals to be added or storage capacitors. The scaling factor by which the voltage dropped across the parallel circuit of the storage capacitors is less than the sum of the signals to be added is consequently equal to the reciprocal of the number of storage capacitors.

Given a reference voltage $V_{ref}$ suitably applied at the reference-voltage input 24, a further charge exchange occurs in such a way that the voltage dropped across the parallel-connected storage capacitors is reduced by the reference voltage $V_{ref}$. For this purpose, a reference-voltage buffer 20 that provides the reference voltage $V_{ref}$ comprises operational amplifier elements without feedback loops. As a result, charge can be provided or received at high speed so that a small distortion is ensured in the addition of the signals.

As illustrated in FIG. 1, an input signal of a quantization circuit 50 is derived from the output signal of the adding circuit 10. The design of the adding circuit 10 makes it possible to use the storage capacitors 21, 22 as input capacitors of comparator elements of the quantization circuit 50, which reduces the space requirement of the circuit on a semiconductor chip. In this connection, the reference voltage $V_{ref}$ for the comparator elements is provided via the reference-voltage input 24 of the adding circuit.

Figure 2:
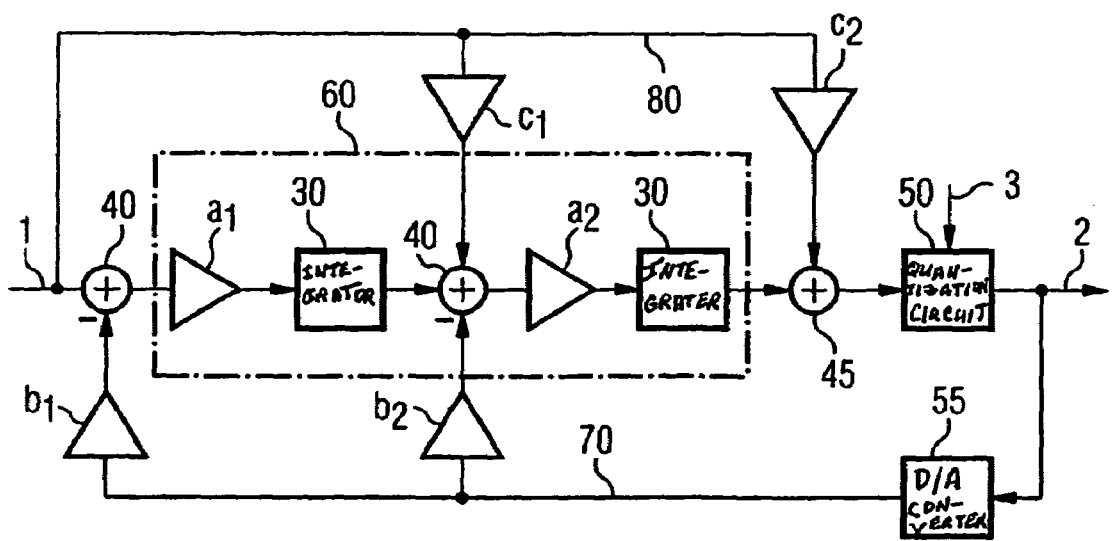
FIG. 2 illustrates diagrammatically a switched-capacitor sigma-delta modulator circuit having a feed-forward loop, an adding circuit as shown in FIG. 1 being used to add a feed-forward input signal of the sigma-delta modulator circuit to an output signal of a loop filter.

FIG. 2 illustrated diagrammatically a second-order sigma-delta modulator circuit. The sigma-delta modulator circuit comprises a loop filter 60 having two integrator or integrator means 30 connected in series, a feedback loop 70, a feed-forward loop 80 and a quantization circuit 50. Summation points or nodes 40, 45 of the sigma-delta modulator circuit are situated at signal inputs and signal outputs of the integrator or integrator means 30. The node 45 at the signal output of the final integrator or integrator means 30, i.e., of the second integrator or integrator means, is identical to a node 45 at the signal input of the quantization circuit 50. The integrator means 30 are implemented by means of single-stage operational transconductance amplifier elements (OTA).

The feedback loop 70 is configured in such a way that it couples back the digital output signal 2 of the sigma-delta modulator circuit, which signal is converted into an analog signal by a digital/analog converter circuit 55, to all the nodes 40 at the signal inputs of the integrator means 30.

The feed-forward loop 80 is configured in such a way that it feeds forward an input signal 1 of the sigma-delta modulator circuit to all the nodes situated at the signal output of the integrator means 30.

The sigma-delta modulator circuit is configured as a switched-capacitor sigma-delta modulator circuit, i.e., signals are sampled at the signal inputs of the integrator means 30 and the quantization circuit 50 by charging corresponding input capacitors.

Coupling coefficients $a_1$, $a_2$ of the loop filter 60, feedback coefficients $b_1$, $b_2$ of the feedback loop 70 and feed-forward coefficients $c_1$, $c_2$ of the feed-forward loop 80 are chosen in such a way that the signal-transmission function of the sigma-delta modulator circuit is essentially 1. Furthermore, the coupling coefficients $a_1$, $a_2$, the feedback coefficients $b_1$, $b_2$ and the feed-forward coefficients $c_1$, $c_2$ are chosen in such a way that a signal component that is equal to the original input signal 1 of the sigma-delta modulator circuit is minimized at the signal inputs of the integrator means 30, with the result that only low signal levels that are equal to a digitization noise 3 occurring in the quantization circuit 50 occur at the corresponding nodes 40. As a result, a distortion-free operation of the single-stage transconductance amplifier elements of the integration or integration means 30 is ensured.

The signal addition at the node 45 situated upstream of the signal input of the quantization circuit 50 takes place by means of the adding circuit 10 explained with reference to FIG. 1. The signals to be added are consequently the output signal of the loop filter 60 and the fed-forward signal of the feed-forward loop 80. The input signal of the quantization circuit 50 is derived from the output signal of the adding circuit. The input capacitors of the quantization circuit 50 are formed by the storage capacitors 21, 22 of the adding circuit 10.

In this connection, the quantization circuit 50 has a gain that is equal to the reciprocal of the scaling factor of the adding circuit 10, with the result that a signal reduction by the scaling factor is compensated for by means of the gain. In the special case illustrated comprising two storage capacitors 21, 22, the scaling factor is ½ so that the quantization circuit 50 provides a gain of 2.

The gain of the quantization circuit 50 is achieved by choosing the reference voltage $V_{ref}$ used for the quantization circuit to be less by a factor that is equal to the scaling factor of the adding circuit 10 than a reference voltage that is used for the digital/analog converter circuit 55. As a result, the output signals of the quantization circuit 50 can be amplified at little cost.

The clock voltages for the clocked drive of the switching means 11, 12 of the adding circuit 10 are derived from the clock voltages that are generally used in the switched-capacitor sigma-delta modulator circuits for the clocked drive of switching or switching means. As a result, a separate provision of clock voltages for operating the adding circuit is unnecessary. The clock voltages for the clocked drive of critical switching means of the switched-capacitor sigma-delta modulator circuit, in particular the switching means 11, 12 of the adding circuit, are amplified by so-called clock boosting using charge pumps. This reduces a distortion due to finite switching resistances of the switching means 11, 12.

As is evident from the preceding description of the switched-capacitor sigma-delta modulator circuit, the invention is particularly suitable for adding an output signal of the loop filter 60 and of the fed-forward signal of the feed-forward loop 80 at the node 45 situated at the signal input of the quantization circuit 50. This results in a particularly efficient addition of the signals that does not require, in particular, separate active blocks, thereby ensuring a low power consumption of the sigma-delta modulator circuit. The simultaneous utilization of the storage capacitors 21, 22 as input capacitance of the quantization circuit 50 moreover makes possible a further space saving on the semiconductor chip.

However, the invention is not restricted to this preferred field of application. The adding circuit can be extended to a multiplicity of signals to be added and is generally preferably applicable to the addition of signals in switched-capacitor arrangements with subsequent quantization. The invention is also suitable, for example, for use in a successive-approximation-register analog/digital converter circuit.

The present invention provides an adding circuit 10 that is suitable for an efficient addition of signals at the signal input of the quantization circuit of a switched-capacitor sigma-delta modulator circuit.

In one embodiment, an adding circuit 10 according to the invention comprises, for this purpose, storage capacitors and switches or switching means. The adding circuit is designed in such a way that, during a first clock phase, each storage capacitor is charged by a suitable signal voltage. In a second clock phase, the storage capacitors are decoupled from the signal voltages with the aid of the switching means 11, 12 and connected in parallel so that charge equalization occurs between the storage capacitors 21, 22. An output signal of the adding circuit is formed by a voltage that drops across the parallel-connected storage capacitors after the charge equalization.

In one preferred embodiment, the storage capacitors 21, 22 have substantially identical capacitances.

Furthermore, it is advantageous to configure the adding circuit 10 in such a way that, after the charge equalization, the voltage dropped across the parallel-connected storage capacitors 21, 22 is equal to a sum of the voltage signals to be added except for a proportionality factor or a scaling factor.

In particular, the adding circuit 10 can be configured in such a way that, given essentially identical capacitances of the storage capacitors 21, 22, this scaling factor is equal to the reciprocal of the number of storage capacitors.

The adding circuit may moreover comprise a reference-voltage input. The reference-voltage input serves to receive a reference voltage, for example for a quantization circuit connected downstream of the adding circuit 10. In this connection, the adding circuit 10 is configured in such a way that a further charge exchange occurs owing to the applied reference voltage, with the result that, after charge equalization has taken place, the voltage that drops across the parallel-connected storage capacitors 21, 22 is reduced or increased by an amount that is equal to the reference voltage.

The adding circuit 10 according to the invention is particularly suitable for adding signals at a summation point or a node of a switched-capacitor sigma-delta modulator circuit, for example in a broadband data-transmission system, in particular for adding signals at a node situated at the signal input of the quantization circuit of the sigma-delta modulator circuit. At such a node of the sigma-delta modulator circuit, there may be present, for example, the output signals of a loop filter of the sigma-delta modulator circuit, fed back signals of a feedback loop of the sigma-delta modulator circuit or fed-forward signals of a feed-forward loop of the sigma-delta modulator circuit.

In the sigma-delta modulator circuit that comprises an adding circuit 10 according to the invention for adding signals at the signal input of the quantization circuit, the quantization circuit is preferably configured in such a way that the gain of the quantization circuit is equal to the reciprocal of the scaling factor of the adding circuit. In this way, it is easily possible to compensate for a signal reduction by means of the scaling factor.

The gain of the quantization circuit is preferably ensured in that the chosen reference voltage for the quantization circuit is smaller than a reference voltage used for a digital/analog converter circuit of the feedback loop by a factor that is equal to the scaling factor.

The sigma-delta modulator circuit may be configured in such a way that the loop filter comprises at least one integrator or integrator means 30, nodes of the sigma-delta modulator circuit being situated at a signal input or at a signal output of the at least one integrator or integrator means 30. In this connection, the feedback loop is preferably configured in such a way that an output signal of the quantization circuit is fed back to nodes at the signal inputs of the integrator means. The feed-forward loop is preferably configured in such a way that an input signal of the sigma-delta modulator circuit is fed forward to nodes at the signal outputs of the integrator means. In this connection, a node at the signal output of a final integrator means corresponds to the node at the signal input of the quantization circuit.

Those signals of the adding circuit at the signal input of the quantization circuit that are to be added are consequently preferably a feed-forward input signal of the sigma-delta modulator circuit and an output signal of the final integrator means 30 of the loop filter.

As a result of using the feed-forward loop, signal levels can be optimally set at the nodes of the sigma-delta modulator circuit, with the result that a signal component of the input signal of the sigma-delta modulator circuit is minimized and, in the ideal case, a signal component of a digitizing noise is exclusively processed in the loop filter.

The use of the adding circuit 10 according to the invention at the signal output of the final integrator or integrator means 30, i.e., at the signal input of the quantization circuit, offers the advantage of a simple and efficient addition without further active blocks being necessary in the sigma-delta modulator circuit. As a result, the advantages of feeding forward signals to nodes of the sigma-delta modulator circuit are exploited to an optimum extent. All in all, this results in a reduced power consumption of the circuit and a reduced space requirement in an implementation of the sigma-delta modulator circuit on a semiconductor chip.

The invention is particularly suitable for use in a switched-capacitor sigma-delta modulator circuit, for example, in a broadband data-transmission system, but it is not restricted to this preferred field of application.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An adding circuit for adding a first signal to be added to at least a further signal to be added, wherein the adding circuit comprising:
a first storage capacitor, at least one further storage capacitor and switching or switching means, wherein the adding circuit is configured in such a way that, during a first clock phase, each of the signals to be added is stored in a respective storage capacitor by charging the storage capacitor; and
wherein, during a second clock phase, the storage capacitors are connected in parallel by means of the switching or switching means, as a result of which a charge equalization takes place between the storage capacitors, with the result that, after the charge equalization, a voltage dropped across the parallel-connected storage capacitors forms an output signal of the adding circuit.

2. The adding circuit according to claim 1, wherein the storage capacitors have substantially equal capacitances.

3. The adding circuit according to claim 1, wherein the adding circuit is configured in such a way that, after the charge equalization, the voltage dropped across the parallel-connected storage capacitors is equal to the sum of the signals to be added except for a scaling factor.

4. The adding circuit according to claim 3, wherein the scaling factor is equal to the reciprocal of the number of storage capacitors.

5. The adding circuit according to claim 1, comprising a reference-voltage input for receiving a reference voltage.

6. A sigma-delta modulator circuit comprising:
a loop filter having at least one integrator or integrator means for noise shaping, a quantization circuit for quantizing an output signal of the loop filter, a feedback loop having a digital/analog converter circuit for feeding back a digital output signal of the sigma-delta modulator circuit to at least one node of the loop filter, and at least one adding circuit,
wherein the adding circuit is configured in such a way that, during a first clock phase, each of the signals to be added is stored in a respective storage capacitor by charging the storage capacitor, and
wherein, during a second clock phase, the storage capacitors are connected in parallel by means of the switching or switching means, as a result of which a charge equalization takes place between the storage capacitors, with the result that, after the charge equalization, a voltage dropped across the parallel-connected storage capacitors forms an output signal of the adding circuit.

7. The circuit according to claim 6, wherein the storage capacitors essentially have equal capacitances.

8. The circuit according to claim 6, wherein the adding circuit is configured in such a way that, after the charge equalization, the voltage dropped across the parallel-connected storage capacitors is equal to the sum of the signals to be added except for a scaling factor.

9. The circuit according to claim 8, wherein the storage capacitors essentially have equal capacitances, and wherein the scaling factor is equal to the reciprocal of the number of storage capacitors.

10. The circuit according to claim 6, comprising a reference-voltage input for receiving a reference voltage.

11. The circuit according to claim 6, wherein the feedback loop is configured to feed back the digital output signal of the sigma-delta modulator circuit to nodes at the signal inputs of all the integrator or integrator means of the loop filter.

12. The circuit according to claim 6, comprising a feed-forward loop for feeding forward an input signal of the sigma-delta modulator circuit to at least one node at a signal output of the at least one integrator element of the sigma-delta modulator circuit.

13. The circuit according to claim 12, wherein the feed-forward loop is configured to feed-forward the input signal of the sigma-delta modulator circuit to nodes at signal outputs of all the integrator or integrator means of the loop filter.

14. The circuit according to claim 12, wherein coupling coefficients of the loop filter, feedback coefficients of the feedback loop, feed-forward coefficients of the feed-forward loop are matched in such a way that a signal transmission function of the sigma-delta modulator circuit is essentially 1.

15. The circuit according to claim 6, wherein the sigma-delta modulator circuit is configured as a switched-capacitor sigma-delta modulator circuit.

16. The circuit according to claim 6, wherein the at least one adding circuit is disposed at a node at the signal input of the quantization circuit.

17. The circuit according to claim 16, wherein the at least one adding circuit is configured in such a way that, after the charge equalization, the voltage dropped across the parallel-connected storage capacitors is equal to the sum of the signals to be added except for a scaling factor, and in that the quantization circuit is configured in such a way that a gain of the quantization circuit has a value that is equal to the reciprocal of the scaling factor.

18. The circuit according to claim 17, wherein the gain of the quantization circuit is provided by choosing a reference voltage of the quantization circuit that is a factor less than a reference voltage of the digital/analog converter circuit of the feedback loop, the factor being equal to the scaling factor of the adding circuit.

19. The circuit according to claim 16, wherein the sigma delta modulator circuit is configured as a switched-capacitor sigma-delta modulator circuit, the storage capacitors of the adding circuit simultaneously serving as input capacitors of the quantization circuit.

20. The circuit according to claim 6, wherein clock voltage amplification or amplification means for amplifying a clock voltage are provided for the clocked drive of the switching or switching means of the adding circuit.

21. The circuit according to claim 6, wherein at least one of the integrator or integrator means is essentially formed by a single-stage operational transconductance amplifier element.

22. The circuit according to claim 6, comprising a reference-voltage buffer for providing reference voltages for comparator elements of the quantization circuit via a reference-voltage input of the adding circuit, the reference-voltage buffer comprising operational amplifier elements without feedback loops.

23. The circuit according to claim 6, wherein the sigma-delta modulator circuit is configured for use in a broadband data-transmission system.

24. An adding circuit for adding a plurality of input signals, including a first input signal and a second input signal, comprising:
    a first capacitor, wherein during a first clock phase the first storage capacitor stores the first input signal;
    a second capacitor, wherein during the first clock phase the second storage capacitor stores the second input signal; and
    a switch mechanism, wherein during a second clock phase the first storage capacitor and the second storage capacitor are configured in parallel via the switch mechanism, and an output signal is provided corresponding to the voltage drop across the first capacitor and the second capacitor connected in parallel.

25. The circuit of claim 24, wherein the output signal is equal to the first input signal plus the second input signal plus a scaling factor.

26. The circuit of claim 25, wherein the scaling factor is equal to the reciprocal of the number of capacitors.

27. The circuit of claim 24, wherein the switch mechanism comprises a first switch and a second switch, wherein during the first clock phase the first switch is closed and the second switch is open, and the first input signal is received via the first switch; and
    wherein during the second clock phase the first switch is open and the second switch is closed, and the first capacitor is connected to a reference voltage.

28. The circuit of claim 27, wherein the switch mechanism comprises a third switch and a fourth switch, wherein during the first clock phase the third switch is closed and the fourth switch is open, and the second input signal is received via the third switch; and
    wherein during the second clock phase the third switch is open and the fourth switch is closed, and the second capacitor is connected to the reference voltage, in parallel with the first capacitor.

29. The circuit of claim 28, wherein the first switch, the second switch, the third switch and the fourth switch are transistors.

30. The circuit of claim 24, wherein the first capacitor and the second capacitor have substantially equal capacitances, and after charge equalization across the first capacitor and the second capacitor during the second clock phase, the voltage drop across the first capacitor and the second capacitor is equal to the sum of the first input signal plus the second input signal plus a scaling factor, wherein the scaling factor is equal to the number of capacitors.

31. A sigma-delta modulator circuit comprising:
    an integrator circuit having a first signal;
    a feed forward loop providing a second signal; and
    an adding circuit for adding the first signal and second signal, comprising a first storage capacitor, wherein during a first clock phase the first storage capacitor stores the first signal, a second storage capacitor, wherein during the first clock phase the second storage capacitor stores the second signal, and a switch mechanism, wherein during a second clock phase the first storage capacitor and the second storage capacitor are configured in parallel via the switch mechanism, and an output signal is provided corresponding to the voltage drop across the first capacitor and the second capacitor connected in parallel, equal to the first signal plus the second signal plus a scaling factor.

32. The circuit of claim 31, comprising:
    a quantization circuit for receiving the output signal and providing a modulator circuit output signal; and
    a feedback circuit coupled to the modulator circuit output signal.

* * * * *